United States Patent
Lin et al.

(10) Patent No.: US 6,737,663 B2
(45) Date of Patent: May 18, 2004

(54) APPARATUS AND METHOD FOR DETECTING TILT ANGLE OF A WAFER PLATFORM

(75) Inventors: Hom-Chung Lin, Taichung (TW); Song-Yueha Lin, Yung-count (TW); Hu-Li Sun, Yon-Kan (TW); Chi-Fu Yu, Taipei (TW); Wu-Han Jiang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 153 days.

(21) Appl. No.: 10/152,862

(22) Filed: May 22, 2002

(65) Prior Publication Data

US 2003/0218144 A1 Nov. 27, 2003

(51) Int. Cl.⁷ .................................................. G01N 21/86
(52) U.S. Cl. .............................. 250/559.29; 250/559.12
(58) Field of Search ......................... 250/559.29, 559.3, 250/559.12, 559.13, 548, 222.1, 492.2, 559.37

(56) References Cited

U.S. PATENT DOCUMENTS 5,466,945 A * 11/1995 Brickell et al. ......... 250/559.12
6,274,878 B1 * 8/2001 Li et al. ..................... 250/548

* cited by examiner

*Primary Examiner*—Thanh X. Luu
*Assistant Examiner*—Seung C Sohn
(74) *Attorney, Agent, or Firm*—Tung & Associates

(57) ABSTRACT

An apparatus and a method for detecting the tilt angle of a wafer platform in a process machine, particularly in a medium density ion implanter. The apparatus and method can be used to accurately calibrate the zero-angle position of a wafer platform in the medium energy ion implanter. The apparatus includes a process chamber that has a cavity and a wafer platform therein, a window that is substantially transparent to laser energy mounted in a top wall of the chamber, and a laser emitter and receiver positioned outside the process chamber juxtaposed to the window for emitting a laser beam onto a wafer positioned on the wafer platform and receiving a reflected laser beam to determine a tilt angle of the wafer platform by the intensity of the reflected laser beam.

20 Claims, 3 Drawing Sheets

APPARATUS AND METHOD FOR DETECTING TILT ANGLE OF A WAFER PLATFORM

FIELD OF THE INVENTION

The present invention generally relates to a calibration method for semiconductor process equipment and more particularly, relates to an apparatus and a method for detecting the tilt angle of a wafer platform in a semiconductor process machine.

BACKGROUND OF THE INVENTION

Ion beam implanters are used to implant or "dope" silicon wafers with impurities to produce n or p type doped regions on the wafers. The n and p type material regions are utilized in the production of semiconductor integrated circuits. Implanting ions generated from source materials such as antimony, arsenic or phosphorus results in n type material. If p type material is desired, ions generated with source materials such as boron, gallium or indium are typically used.

The ion beam implanter includes an ion source for generating positively charged ions from ionizable source materials. The generated ions are formed into a beam and accelerated along a predetermined beam path to an implantation station. The beam is formed and shaped by apparatus located along the beam path en route to the implantation station. When operating the implanter, the interior region must be evacuated to reduce the probability of ions being deflected from the predetermined beam path as a result of collisions with air molecules.

During ion implantation a surface is uniformly irradiated by a beam of ions or molecules, of a specific species and prescribed energy. The size of the wafer or substrate (e.g. 8 inches or greater) is typically much larger than the cross-section of the irradiating beam which deposits on the wafer as a spot or "ribbon" of about 1 inch. Commonly, in high current machines, the required uniform irradiance is achieved by moving the wafer through the beam.

Operation of an ion implanter results in the production of certain contaminant materials. These contaminant materials adhere to surfaces of the implanter beam forming and shaping structure adjacent the ion beam path and also on the surface of the wafer support facing the ion beam. Contaminant materials also include undesirable species of ions generated in the ion source, that is, ions having the either the wrong atomic mass or undesired ions of the same atomic mass.

In a conventional ion implanter 10 such as that shown in FIG. 1, an ion beam 12 is emitted from an ion source 14 and passed through a pre-analyzing magnet 16 to remove undesired types of ions. Ions having identical energies but different masses experience a different magnetic force as they pass through the magnetic field due to their differing masses thereby altering their pathways. As a result, only those desired ions of a particular atomic mass unit (AMU) are allowed to pass through a prepositioned orifice in the pre-analyzing magnet.

After passing through the pre-analyzing magnet the ion beam is accelerated to a desired energy by an accelerator 18. Negative ions are changed into positive ions by a charge exchange process involving collisions with a chemically inert gas such as argon. The positive ions then pass through a post-analyzing magnet (not shown) and a pair of vertical and horizontal scanners 20, 22 finally reach a wafer 24 where they impact the wafer 24 and are implanted.

Ion implantation has the ability to precisely control the number of implanted dopant atoms into substrates to within 3%. For dopant control in the $10^{14}$–$10^{18}$ atoms/cm$^3$ range, ion implantation is superior to chemical diffusion techniques. Heavy doping with an ion implanter, for example, can be used to alter the etch characteristics of materials for patterning. The implantation may be performed through materials that may already be in place while other materials may be used as masks to create specific doping profiles. Furthermore, more than one type of dopant may be implanted at the same time and at the same position on the wafer. Other advantages include the fact that ion implantation may be performed at low temperature which does not harm photoresist and in high vacuum which provides a clean environment.

In the convention ion implanter 10 of FIG. 1, the wafer to be implanted is clamped onto a wafer platform during the implantation process. For instance, such a wafer platform 32 is shown in FIG. 2 in a sample holding device 30 complete with a rotation mechanism 34. A perspective view of the wafer platform 32 in a horizontal position is shown in FIG. 3. After a wafer is mounted to the wafer platform 32, either by mechanical clamping or by electrostatic chucking, the wafer platform is turned by the rotational mechanism 34 into a vertical position such that ions from the ion beam emitter which are emitted in a horizontal direction may be bombarded on the surface of the wafer. The orientation of the wafer platform in the vertical direction is therefore very important for achieving a highly accurate implantation process. The criticality of the wafer platform orientation, i.e., the maintaining of a zero-angle position, becomes more important in the next generation wafer processes, such as for the 0.13 µm process. It has been found that when the tilt angle of the wafer platform 32 deviates about 2° from a zero-angle position during an ion implantation process, a variation as large as 20–30 mV in the threshold voltage value for the device produced may result. It is therefore an important process for calibrating the tilt angle of a wafer platform in order to avoid reliability issues.

It is therefore an object of the present invention to provide an apparatus for detecting the tilt angle of a wafer platform in a process machine that does not have the drawbacks or shortcomings of the conventional calibration apparatus.

It is another object of the present invention to provide an apparatus for calibrating the zero-angle position of a wafer platform in an ion implantation machine.

It is a further object of the present invention to provide an apparatus for calibrating the zero-angle position of a wafer platform in a medium current ion implanter that can be used out with high repeatability.

It is another further object of the present invention to provide an apparatus for detecting the tilt angle of a wafer platform in a process machine by utilizing laser optics, including a laser emitter and a laser receiver mounted in the machine.

It is still another object of the present invention to provide an apparatus for detecting the tilt angle of a wafer platform in a process machine by measuring the reflectance angle of a laser beam reflecting off a wafer surface that is sensitive to a change in the tilt angle.

It is yet another object of the present invention to provide a method for calibrating the zero-angle position of a wafer platform in a medium current ion implanter.

SUMMARY OF THE INVENTION

In accordance with the present invention, an apparatus and a method for detecting the tilt angle of a wafer platform are provided.

In a preferred embodiment, an apparatus for detecting the tilt angle of a wafer platform in a process machine is provided which includes a process chamber that has a cavity and a wafer platform in the cavity; a window that is substantially transparent to laser energy in a top wall of the process chamber; and a laser emitter and receiver positioned outside the process chamber juxtaposed to the window for emitting a laser beam onto a wafer positioned on the wafer platform and receiving a reflected laser beam to determined a tilt angle of the wafer platform by the intensity of the reflected laser beam.

In the apparatus for detecting the tilt angle of a wafer platform in a process machine, the laser emitter emits a continuous laser beam, or the laser emitter may be adjusted to emit a laser beam onto a portion of the wafer within 1 mm from an edge of the wafer. The process machine may be an ion implanter, or a medium current ion implanter. The wafer platform may be equipped with a mechanical clamping device, or may be equipped with an electrostatic chucking device. The window may be formed of quartz. The laser emitter may be adjusted to emit a laser beam onto a portion of the wafer that does not have active device built thereon. The process chamber may further include means for rotating the wafer platform from a horizontal loading position to a vertical test position.

The present invention is further directed to a method for detecting the tilt angle of a wafer platform in a process machine which can be carried out by the operating steps of first providing a chamber for the process machine that is equipped with a top wall, a bottom wall, and side walls connecting the top and bottom walls, and a wafer platform; then mounting a window that is substantially transparent to laser energy in the top wall; positioning a laser emitter and receiver outside the chamber juxtaposed to the window; and emitting a laser beam onto a top surface of a wafer positioned on the wafer platform and receiving a reflected laser beam by the receiver and determining an intensity of the reflected beam.

The method for detecting the tilt angle of a wafer platform in a process machine may further include the steps of providing a wafer platform that is situated in a horizontal position in the chamber, and then positioning a wafer on top of the wafer platform. The method may further include the step of emitting a continuous laser beam from the laser emitter. The method may further include the step of emitting a laser beam onto a portion of the wafer that is within 1 mm from an edge of the wafer, or the step of emitting a laser beam onto a portion of the wafer that does not have active devices built thereon. The method may further include the step of mounting a quartz window in the top wall. The method may further include the step of calculating a tilt angle from an intensity of reflected laser measured. The method may further include the step of clamping a wafer on the wafer platform by mechanical clamping means, or by electrostatic chucking means. The method may further include the steps of rotating the wafer on a wafer platform from a horizontal loading position to a vertical ion implantation position, and ion implanting a top surface of the wafer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for detecting the tilt angle of a wafer platform, and more particularly, for calibrating the zero-angle position of a wafer platform in an ion implanter.

The apparatus for detecting the tilt angle of a wafer platform in a process machine can be constructed by a process machine that has a cavity and a wafer platform situated in the cavity; a window that is substantially transparent to laser energy mounted in a top wall of the process chamber; and a laser emitter and receiver positioned outside the process chamber immediately adjacent to the window for emitting a laser beam into the chamber cavity and onto a wafer positioned on the wafer platform. A reflected laser beam from the wafer surface is then received by the laser receiver to determine a tilt angle of the wafer platform, i.e., or the zero-angle position of the wafer platform, by measuring an intensity of the reflected laser beam.

It is the unique discovery of the present invention that a minute change in the tilt angle of the wafer platform results in a large variation in the intensity of the reflected laser beam. The high sensitivity of the laser intensity change based on any change in the tilt angle can therefore be used in the present invention method to detect the tilt angle of the wafer platform.

It is a further unique discovery of the present invention that the laser beam should be projected onto an area of the wafer that does not have active devices built thereon. For instance, either at an edge portion such as within 1 mm from the wafer edge, or at areas in between the active devices. Since such areas only has silicon oxide insulating layer deposited on top, the silicon oxide layer does not affect the intensity of the reflected laser beam and thus allowing an accurate measurement of the tilt angle of the wafer platform.

Figure 1:
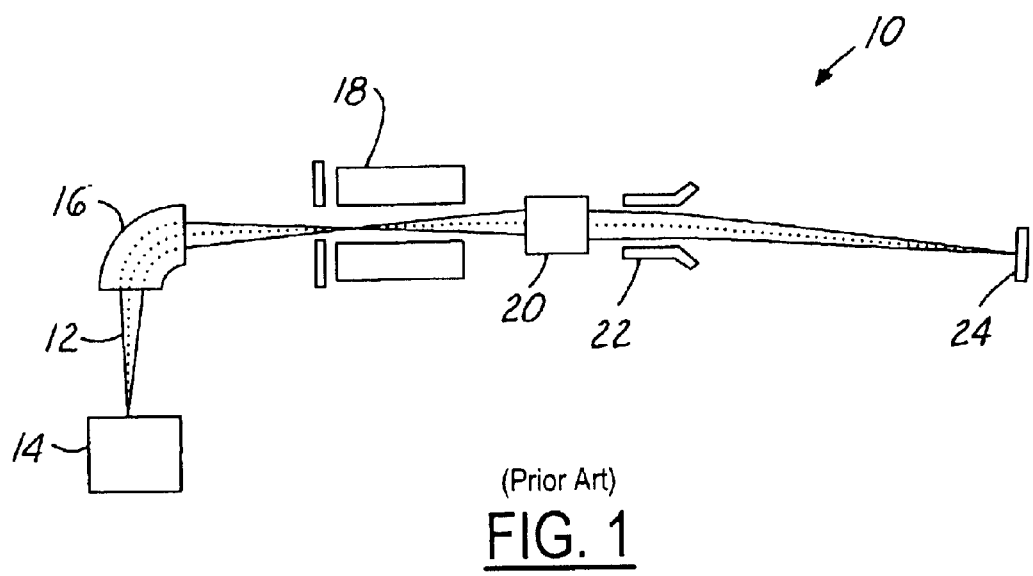
FIG. 1 is a schematic showing a set-up of the conventional ion implanter.
Figure 2:
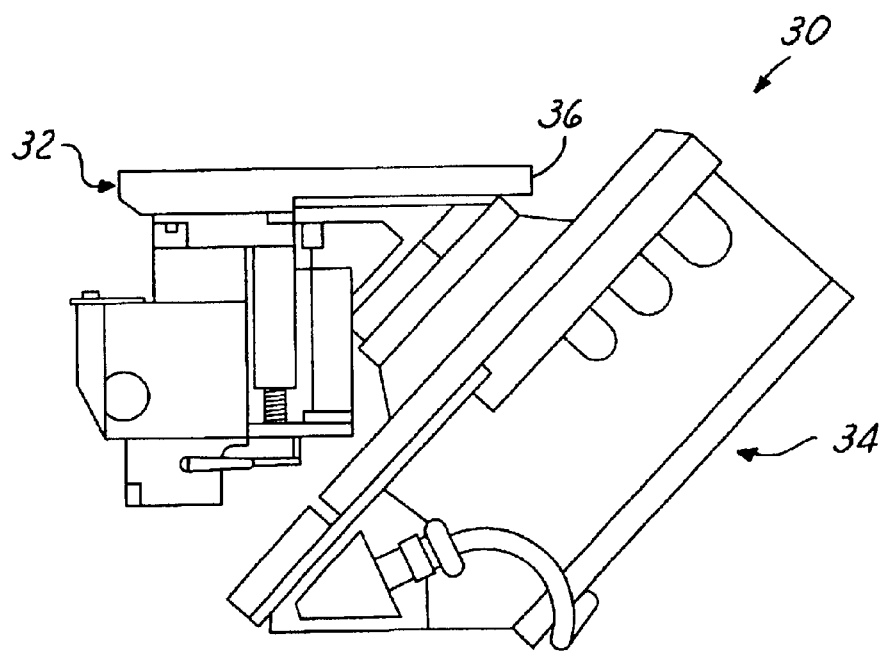
FIG. 2 is a side view of a wafer platform and rotating means used in a convention medium current ion implanter.
Figure 3:
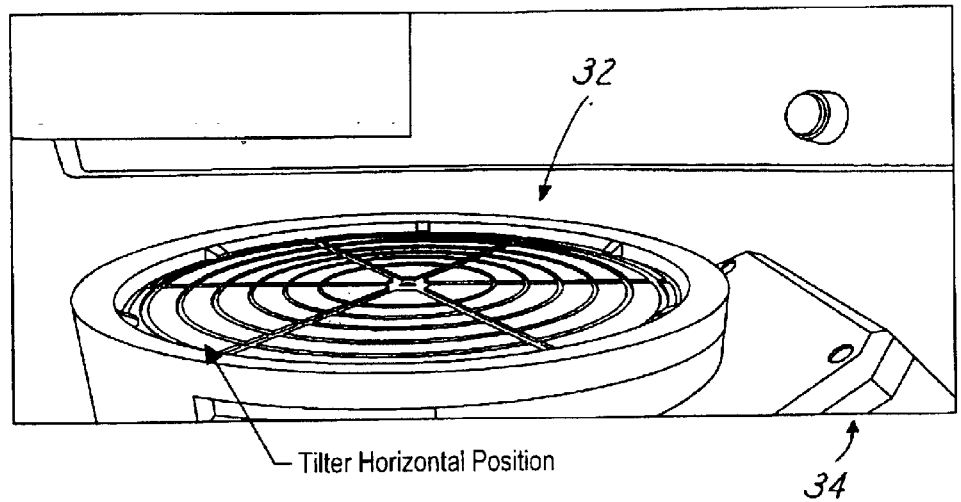
FIG. 3 is a perspective view of a wafer platform placed in a horizontal loading position for loading a wafer.
Figure 4:
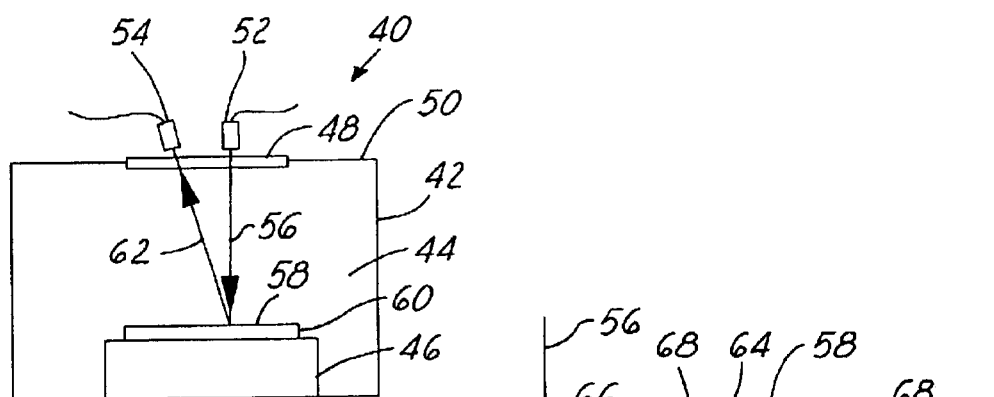
FIG. 4 is a cross-sectional view of the present invention apparatus for detecting the tilt angle of a wafer platform in an ion implanter.

Referring now to FIG. 4 wherein a cross-sectional view of the present invention apparatus 40 is shown. The apparatus 40 is constructed of a process chamber 42 that has a cavity 44 and a wafer platform 46 therein. The apparatus is further constructed with a window 48 that is substantially transparent to laser energy mounted in a top wall 50 of the process chamber 42. The apparatus 40 further includes a laser emitter 52 and a laser receiver 54 positioned outside the process chamber 42 but immediately adjacent to the window 48 for emitting a laser beam 56 onto the top surface 58 of a wafer 60. A reflected laser beam 62 from the top surface 58 is received by the laser receiver 54. By determining the intensity of the reflected laser beam 62, a tilt angle of the wafer platform 46 can be determined.

Figure 7:
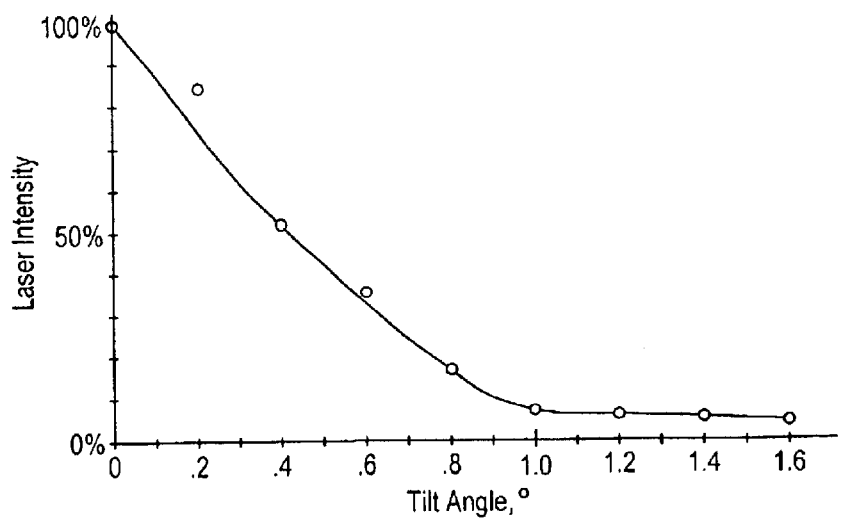
FIG. 7 is a graph illustrating the dependency of laser intensities on the tilt angle of the wafer platform.

As shown in FIG. 7, the reflected laser intensity is very sensitive to the tilt angle of the wafer platform 46. For instance, the laser intensity at zero-angle position is measured and set as 100% intensity. At a small tilt angle of 0.2°, the laser intensity dropped by about 25%. At a wafer platform tilt angle of 0.6°, the reflected laser beam intensity drops to less than 40% of the original intensity (at 0° tilt angle). The large variation in the laser beam intensity therefore provides an accurate measurement of the tilt angle of the wafer platform.

Figure 5:
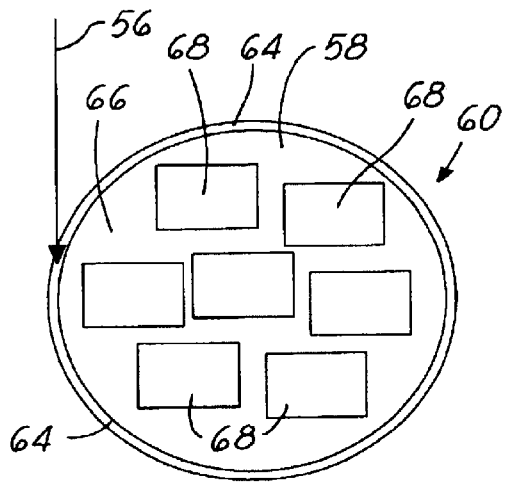
FIG. 5 is an illustration of the present invention method for projecting a laser beam on the edge portion of a wafer that does not have built-in active devices.

To carry out the present invention novel method, the laser beam 56 should be directed at an area on the top surface 58 of wafer 60 where there are no active devices built. For instance, as shown in FIG. 5, an obvious area to choose is along the edge of the wafer 60. The edge portion 64 of the wafer 60 only has a coating layer of silicon oxide on top and thus, will not affect the intensity of the reflected laser beam, other than by the tilt angle of the wafer platform. Other possible areas for conducting the present invention novel method is the area 66 in between the IC dies 68 where only an insulating material layer of $SiO_2$ exists.

Figure 6:
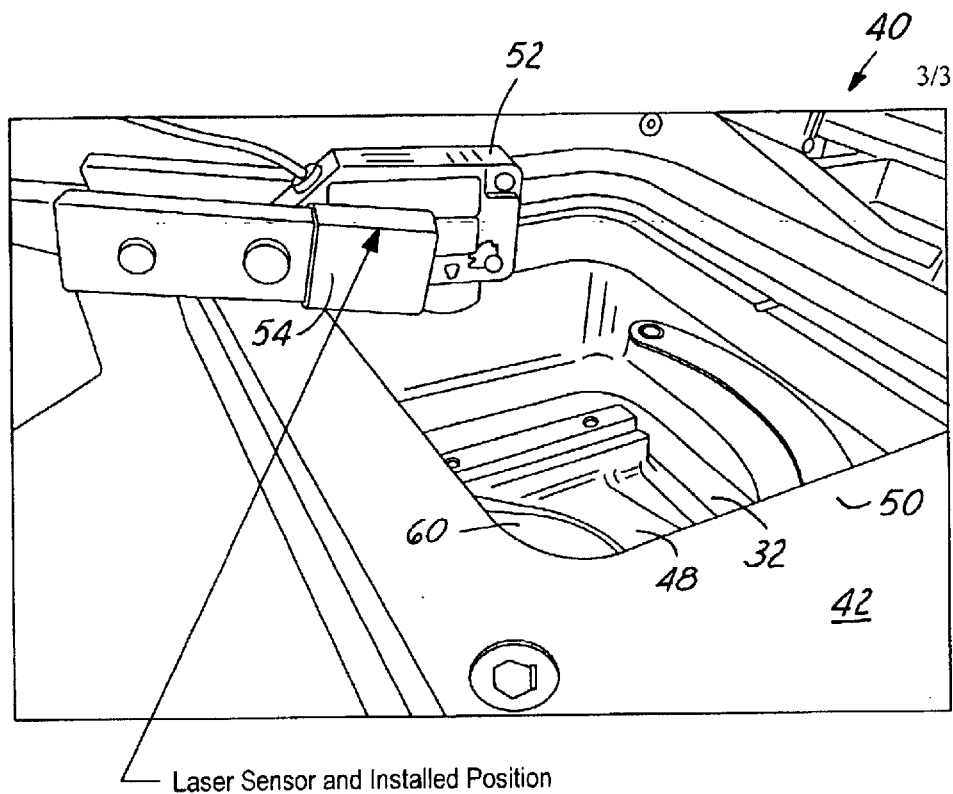
FIG. 6 is a perspective view of a present invention laser emitter/receiver positioned juxtaposed to a quartz window on top of the ion implanter.

The present invention apparatus 40 is further shown in a perspective view in FIG. 6. The laser emitter 52 and the laser receiver 54 are positioned on top of window 48 mounted the top wall 50 of the ion implantation chamber 42. The laser beam 56 (not shown) is directed onto the surface of wafer 60 positioned on the wafer platform 32 (or 46 in FIG. 4).

The present invention novel apparatus and a method for detecting the tilt angle of a wafer platform in a process machine, and particularly the calibration of zero-angle position of a wafer platform in a medium density ion implanter have therefore been amply described in the above description and in the appended drawings of FIGS. 4–7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for detecting tilt angle of a wafer platform in a process machine comprising:
    a process chamber having a cavity and a wafer platform in said cavity;
    a window that is substantially transparent to laser energy in a top wall of said chamber; and
    a laser emitter and receiver positioned outside said process chamber juxtaposed to said window for emitting a laser beam onto a wafer positioned on said wafer platform and receiving a reflected laser beam to determine a tilt angle of said wafer platform by an intensity of said reflected laser beam.

2. An apparatus for detecting tilt angle of a wafer platform in a process machine according to claim 1, wherein said laser emitter emits a continues laser beam.

3. An apparatus for detecting tilt angle of a wafer platform in a process machine according to claim 1, wherein said laser emitter being adjusted to emit a laser beam onto a portion of said wafer within 1 mm from an edge of said wafer.

4. An apparatus for detecting tilt angle of a wafer platform in a process machine according to claim 1, wherein said process machine is an ion implanter.

5. An apparatus for detecting tilt angle of a wafer platform in a process machine according to claim 1, wherein said process machine is a medium current ion implanter.

6. An apparatus for detecting tilt angle of a wafer platform in a process machine according to claim 1, wherein said wafer platform being equipped with a mechanical clamping device.

7. An apparatus for detecting tilt angle of a wafer platform in a process machine according to claim 1, wherein said wafer platform being equipped with an electrostatic chucking device.

8. An apparatus for detecting tilt angle of a wafer platform in a process machine according to claim 1, wherein said window is formed of quartz.

9. An apparatus for detecting tilt angle of a wafer platform in a process machine according to claim 1, wherein said laser emitter being adjusted to emit a laser beam onto a portion of said wafer that does not have active device built thereon.

10. An apparatus for detecting tilt angle of a wafer platform in a process machine according to claim 1, wherein said process chamber further comprising means for rotating said wafer platform from a horizontal loading position to a vertical test position.

11. A method for detecting tilt angle of a wafer platform in a process machine comprising the steps of:
    providing a chamber for said process machine equipped with a top wall, a bottom wall and sidewalls connecting said top and bottom walls, and a wafer platform;
    mounting a window that is substantially transparent to laser energy in said top wall;
    positioning a laser emitter and receiver outside said chamber juxtaposed to said window; and
    emitting a laser beam onto a top surface of a wafer positioned on said wafer platform and receiving a reflected laser beam by said receiver and determining an intensity of said reflected beam.

12. A method for detecting tilt angle of a wafer platform in a process machine according to claim 11 further comprising the steps of providing a wafer platform situated in a horizontal position in said chamber and positioning a wafer on top of said wafer platform.

13. A method for detecting tilt angle of a wafer platform in a process machine according to claim 11 further comprising the step of emitting a continues laser beam from said laser emitter.

14. A method for detecting tilt angle of a wafer platform in a process machine according to claim 11 further comprising the step of emitting a laser beam onto a portion of said wafer that is within 1 mm from an edge of said wafer.

15. A method for detecting tilt angle of a wafer platform in a process machine according to claim 11 further comprising the step of emitting a laser beam onto a potion of said wafer that does not have active devices.

16. A method for detecting tilt angle of a wafer platform in a process machine according to claim 11 further comprising the step of mounting a quartz window in said top wall.

17. A method for detecting tilt angle of a wafer platform in a process machine according to claim 11 further comprising the step of calculating a tilt angle from an intensity of reflected laser beam measured.

18. A method for detecting tilt angle of a wafer platform in a process machine according to claim 11 further comprising the step of clamping a wafer on said wafer platform by mechanical clamping means.

19. A method for detecting tilt angle of a wafer platform in a process machine according to claim 11 further comprising the step of clamping a wafer on said wafer platform by electrostatic chucking means.

20. A method for detecting tilt angle of a wafer platform in a process machine according to claim 11 further comprising the steps of rotating said wafer on said wafer platform from a horizontal loading position to a vertical ion implantation position and ion implanting a top surface of said wafer.

* * * * *